United States Patent [19]
Chen et al.

[11] Patent Number: 5,824,605
[45] Date of Patent: Oct. 20, 1998

[54] GAS DISPERSION WINDOW FOR PLASMA APPARATUS AND METHOD OF USE THEREOF

[75] Inventors: Ching-Hwa Chen, Milpitas; David Liu, Saratoga; Mark J. Christensen, Fremont, all of Calif.

[73] Assignee: Lam Research Corporation, Fremont, Calif.

[21] Appl. No.: 509,080

[22] Filed: Jul. 31, 1995

[51] Int. Cl.$^6$ ................................................. H05H 1/00
[52] U.S. Cl. ........................ 438/729; 438/758; 216/68; 156/345; 118/723 I
[58] Field of Search ................ 156/345; 118/723 I, 118/723 IR, 723 R, 723 E, 723 ER, 723 MW; 204/298.33, 298.07; 438/729, 758; 216/68

[56] References Cited

U.S. PATENT DOCUMENTS

| 4,780,169 | 10/1988 | Stark et al. ............................. 156/345 |
| 4,948,458 | 8/1990 | Ogle .................................... 156/345 X |
| 4,960,488 | 10/1990 | Law et al. ............................ 156/345 X |
| 5,074,456 | 12/1991 | Degner et al. ....................... 156/345 X |
| 5,198,718 | 3/1993 | Davis et al. .......................... 313/359.1 |
| 5,226,967 | 7/1993 | Chen et al. ........................ 118/723 I X |
| 5,304,279 | 4/1994 | Coultas et al. ........................... 156/345 |
| 5,464,476 | 11/1995 | Gibb et al. . |
| 5,525,159 | 6/1996 | Hama et al. . |
| 5,529,657 | 6/1996 | Ishii ................................... 118/723 I X |
| 5,531,834 | 7/1996 | Ishizuka et al. ..................... 156/345 X |
| 5,540,800 | 7/1996 | Qian . |
| 5,580,385 | 12/1996 | Paranjpe et al. . |

Primary Examiner—Thi Dang
Attorney, Agent, or Firm—Burns, Doane, Swecker & Mathis, L.L.P.

[57] ABSTRACT

A gas dispersion window for a plasma etching or plasma deposition reactor including a housing having a chamber in which an article can be treated with plasma. The housing includes at least one inlet port connected to an interior of the chamber through which process gas can be supplied to the chamber. A radiofrequency energy source is arranged to pass radiofrequency energy into the chamber and induce plasma in the interior of the chamber by activating, with an electric field induced by the radiofrequency energy source, process gas supplied to the chamber through the inlet port. A dielectric window formed by spaced apart first and second dielectric members has an inner surface thereof forming part of an inner wall of the chamber. Radiofrequency energy passes from the radiofrequency energy source to the interior of the chamber through the dielectric window. The process gas is supplied to the gap between the first and second dielectric members and passes inwardly into the chamber through gas dispersion holes in the second member.

21 Claims, 3 Drawing Sheets

PROCESS GAS IN

TO VACUUM PUMPS

GAS DISPERSION WINDOW FOR PLASMA APPARATUS AND METHOD OF USE THEREOF

BACKGROUND OF THE INVENTION

The invention relates to apparatuses for processing of substrates using radiofrequency induced plasma in a plasma chamber. In particular, the invention provides apparatuses and methods for generating a plasma of a uniform plasma density.

Gaseous plasma technology is a well known technique used for the fabrication of integrated circuits. Parallel plate reactors have been used extensively for exciting the gases in the reaction chamber to generate the chemical reactions required for thin film etching and deposition of semiconductor wafers. In general, when coupling power through an insulator, previous hardware setups have used 13.56 MHz as the exciting frequency for the gases due to a higher excitation efficiency. For instance, see U.S. Pat. No. 4,948,458 ("Ogle"), the disclosure of which is hereby incorporated by reference.

In apparatuses such as that shown by Ogle, a radiofrequency magnetic field is induced in a low pressure reaction chamber by sending a radiofrequency resonant current through an external planar coil and passing the generated radiofrequency energy through a dielectric window in the chamber. The magnetic field generates a plasma by causing a circulating flux of electrons in a process gas introduced into the chamber to produce a region of ionic and radical species. The plasma so generated is used to etch or deposit materials on a wafer in the chamber.

It has been found that the plasma density across the surface area of the wafer is highly variable in such apparatuses, with densities measured across 150 mm and 200 mm wafer areas being as much as two times larger in some areas than in others. This non-uniform plasma density causes significantly non-uniform oxide and resist etch rates over measured wafer areas and makes it extremely difficult to control critical dimensions of fine line geometry on the wafer.

Normally a flat dielectric window is used with the apparatuses. Its has been observed that the magnetic flux of the planar coil is highest near the window center and, with a flat window, the induced electric field is consequently higher near the window center. Commonly assigned U.S. Pat. No. 5,226,967 discloses a dielectric window having a characteristic cross section, wherein the window is thicker at the center and thinner at the edges, to decrease the higher induced electric field near the window center. However, the arrangement for introducing process gas into the reaction chamber through a gas dispersion ring surrounding the inner periphery of the window can lead to inhomogeneities in gas distribution and consequently a less than ideal plasma distribution across the exposed surface of the window.

SUMMARY OF THE INVENTION

The invention provides a window for a plasma reaction chamber wherein a substrate such as a semiconductor wafer is processed. The window includes a first member of dielectric material, a second member of dielectric material having first and second surfaces with the first surface facing the first member and the second surface facing an interior of the plasma reaction chamber, a plurality of gas dispersion openings in the second member wherein the gas dispersion openings have outlets thereof in fluid communication with the interior of the plasma reaction chamber, and a process gas supply passage in fluid communication with inlets of the gas dispersion openings.

The window according to the invention can include various features. For instance, the gas supply passage can comprise a recess in the first surface of the second member and/or a surface of the first member facing the second member. The second member can have a nonuniform thickness between the first and second surfaces. For instance, the second member can include a central portion surrounded by an annular outer portion, the central portion being at least two times thicker than the outer portion. Alternatively, the second member can include a central portion of uniform thickness surrounded by an outer portion of uniform thickness, the central portion and the outer portion being separated by an intermediate portion of nonuniform thickness, the thickness of the intermediate portion increasing from one end to an opposite end thereof. The first member can have a uniform thickness between opposed surfaces thereof, one of the opposed surfaces facing the second member. The first member can include a process gas inlet in an outer portion thereof, the gas inlet being in fluid communication with the gas supply passage. The gas dispersion openings can comprise holes which are circumferentially and radially spaced apart such that the holes form a pattern of concentric rings. Also, the gas dispersion holes can be arranged such that a higher volume of process gas per unit area is supplied through a central portion of the second member than through an outer portion of the second member, e.g., the central portion covering less than 50% of the second surface. The first and second members can be separated by a gap small enough to prevent plasma ignition therein. In a preferred embodiment, the window is mounted in a transformer-coupled plasma reactor such that an induction coil of the plasma reactor faces an exposed surface of the first member and supplies high frequency electrical power through the first and second members.

The invention also provides a method for treating an article with plasma comprising steps of placing an article within a chamber and introducing process gas into the chamber and generating a uniform electric field in the chamber by passing radiofrequency energy through a dielectric window in the chamber. The dielectric window includes a plurality of gas dispersion openings in fluid communication with an interior of the chamber and a process gas supply passage in fluid communication with the openings allows process gas to be supplied into the chamber. The uniform electric field generates a uniform electron flow in the process gas and thereby generates a plasma of uniform plasma density. The process further includes the step of plasma treating an article by exposing a surface of the article to the plasma generated in the chamber.

BRIEF DESCRIPTION OF THE DRAWINGS

The features and advantages of the present invention will be well understood by reading the following detailed description in conjunction with the drawings in which like numerals indicate similar elements and in which.

DETAILED DESCRIPTION OF THE PREFERRED EMBODIMENTS

Figure 1:
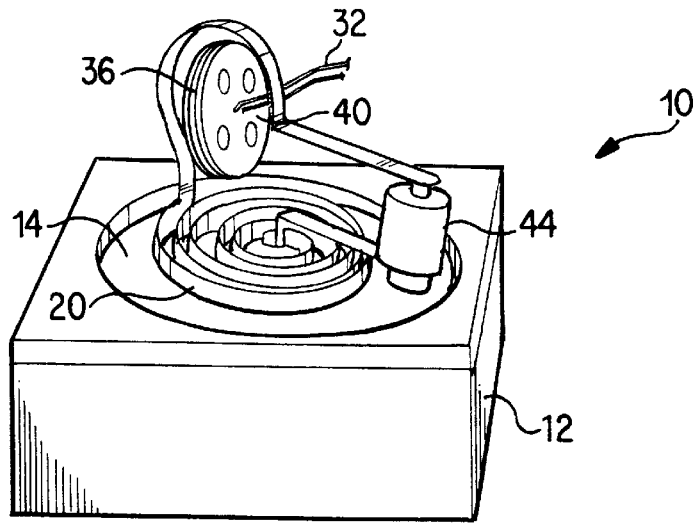
FIG. 1 is an isometric view of an apparatus for producing a planar plasma in accordance with the present invention.

According to the present invention, apparatus and method are provided for producing highly uniform, planar plasmas over relatively large areas. The ionic and radical species produced in the plasma experience minimum acceleration in non-planar directions and the resulting plasma thus has very low desired kinetic energy. In addition, uniform plana plasma can be produced over very wide pressure ranges, typically form $10^{-5}$ Torr to 5 Torr, and greater.

The apparatus of the present invention comprises a housing having an interior chamber bounded at least in part by a dielectric window. A coil such as a planar coil is disposed proximate the window, and a radiofrequency source is coupled to the coil. Usually, the radiofrequency source is coupled through an impedance matching circuit to maximize power transfer and a tuning circuit to provide for resonance at the operating frequency, typically 13.56 MHz. Process gas is supplied to the chamber and by resonating a radiofrequency current through the coil, an electromagnetic field is induced which extends into the chamber through the dielectric window. In this way, a flow of electrons may be induced in the process gas to generate and maintain the gas in a plasma state. Moreover, the electrons can be closely confined to a planar region parallel to the coil whereby transfer of kinetic energy in non-planar directions is minimized.

The chamber includes a support surface for a planar article, typically a semiconductor wafer, flat panel display, or other substrate. The surface preferably supports the substrate in a plane which is parallel to the plane of the plasma. Thus, the substrate can be exposed to a uniform plasma flux, ensuring uniform plasma treatment. As the plasma species have minimum kinetic velocities in non-planar directions, their kinetic impact on the substrate is minimized. Thus, the treatment can be generally limited to the chemical interaction of the plasma species with the substrate.

A velocity component in the direction normal to the surface of the substrate may be provided by applying a radiofrequency potential in a direction normal to the plane of the plasma. Conveniently, such a potential may be applied by the support surface upon which the substrate is maintained. For instance, the support surface can include a conventional bottom electrode for supplying such a potential.

The method and apparatus of the present invention are useful in a variety of semiconductor processing operations, including plasma etching, deposition processes, resist stripping, plasma enhanced chemical vapor depositions, and the like.

The housing defines a generally air-tight interior plasma reaction chamber wherein the planar plasma is to be generated. The housing includes at least one inlet port for introducing a process gas and at least one outlet port for connection to a vacuum system for maintaining a desired operation pressure within the chamber. Systems for supplying a preselected process gas chemistry and for maintaining a preselected pressure within the chamber are well known in the art and need not be described further. One or more surfaces within the chamber support the articles to be treated. Typically, the surfaces to be treated will be disposed in a preselected orientation relative to the planar plasma which is to be generated within the chamber, usually being generally parallel to the plane of the plasma.

In order to induce the desired planar plasma, an electrically-conductive coil is disposed adjacent to the exterior of the dielectric window. The coil can have any substrate geometry effective for coupling RF energy to plasma generated within the reaction chamber. For example, the coil can be substantially planar, convex, concave, etc. As an example, the coil can comprise a single conductive element formed into a planar spiral or a series of concentric rings. By inducing a radiofrequency current within the coil, an electromagnetic field is produced in the plasma reaction chamber which will induce a flow of electrons within a planar region parallel to the plane of the coil.

The coil can be generally circular, although ellipsoidal patterns and other deviations from true circularity can also be used. Moreover, the coil may be truly planar across its diameter, or may deviate somewhat from true planarity (e.g., deviations from planarity can be less than 0.2 of the diameter of the coil, usually being less than 0.1 of the diameter). Adjustments to the profile of the coil may be made to modify the shape of the field which is generated. For instance, when processing semiconductor wafers, the coil can have a diameter corresponding to the size of the plasma which is to be generated. For instance, coil diameters may range from about 8 cm to 30 cm, usually from about 13 cm to 18 cm. When processing an individual semiconductor wafer, the coil diameter will generally be from about 13 to 18 cm.

The coil can include one or more windings having a sufficient number of turns in order to produce a relatively uniform magnetic field across its entire diameter. The number of turns will also depend on the diameter of the coil. A coil having a single winding and sized for treating individual semiconductor wafers usually has from about 5 to 8 turns. The resulting inductance of the coil will usually be from 1.2 to 3.5 $\mu$H, with an impedance in the range from about 20 to 300 Ohms. However, any suitable coil arrangement can be utilized with the apparatus according to the invention.

Conveniently, the coil may be formed from any electrically conductive metals, usually being formed from copper. The coil can have a load carrying capacity in the range from about 5 to 100 amps.

The coil is disposed next to a dielectric window forming part of the treatment chamber. The dielectric window maintains the isolation of the interior of the chamber, while allowing penetration of the magnetic field produced by the coil. The remainder of the housing can be metal. The dielectric window can be composed of quartz, although other dielectric materials, particularly ceramics which do not absorb energy at the frequency of operation, may be used. Conveniently, a dielectric window may be placed adjacent to a port formed in a wall of the housing. For single wafer processing, the geometry of the port can correspond to that of the coil, typically being circular. The coil can be disposed very close to or touching the dielectric window in order to maximize the intensity of the magnetic field produced within the chamber. The thickness of the dielectric window is thin enough to transmit the energy to the plasma, usually being selected to be sufficient to withstand the differential pressure created by the vacuum within the chamber. For example, the window can be at least one-half inch thick or thicker.

The coil is driven by a radiofrequency (RF) generator of a type which is generally utilized in the operation of semiconductor processing equipment. The RF generator will usually operate at a frequency in the range from about 13.56 MHz to 100 MHz, typically being operated at 13.56 MHz. The RF generator usually has a low impedance, typically about 50 Ohms, and will be capable of producing from about 1 to 6 amps, usually from about 2 to 3.5 amps, with an RMS voltage of at least about 50 volts, usually being at least about 70 volts, or more. Conveniently, the RF generator can have an output connector in the form of a coaxial cable which may be connected directly to the circuitry operating the coil.

Figure 2:
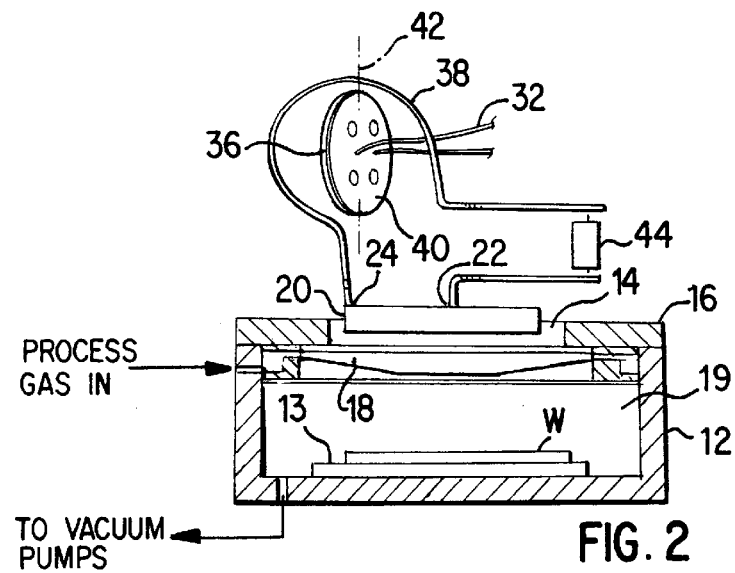
FIG. 2 is a cross-sectional view of the apparatus of FIG. 1.

Referring to FIGS. 1 and 2, a plasma treatment system 10 suitable for plasma etching individual semiconductor wafers W includes a chamber 12 having an access port 14 formed in an upper wall 16. A dielectric shield/window 18 is disposed below the upper wall 16 and extends across the access port 14. The dielectric window 18 is sealed to the wall 16 to define a vacuum-tight interior chamber 19 of the chamber 12.

A planar coil 20 is disposed within the access port 14 adjacent to dielectric window 18. Coil 20 is formed as a spiral having a center tap 22 and an outer tap 24. The plane of the coil 20 is oriented parallel to both the dielectric window 18 and a support surface 13 upon which a substrate such as a wafer W is mounted. In this way, the coil 20 is able to produce a planar plasma within the region 19 of the chamber 12 which is parallel to the wafer W. The distance between the coil 20 and the support surface 13 can be in the range from about 3 to 15 cm, more usually from about 5 to 20 cm with the exact distance depending on the particular application.

Figure 3:
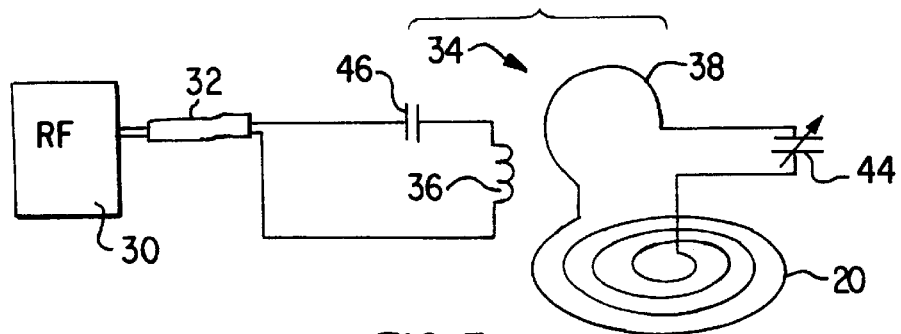
FIG. 3 is a schematic view of the circuitry of the apparatus in FIG. 1.

Referring now to FIGS. 1–3, the planar coil 20 is driven by an RF generator 30 of the type described above. The output of the generator 30 is fed by a coaxial cable 32 to a matching circuit 34. The matching circuit 34 includes a primary coil 36 and a secondary loop 38 which may be mutually positioned to adjust the effective coupling of the circuit and allow for loading of the circuit at the frequency of operation. Conveniently, the primary coil 36 is mounted on a disk 40 which may be rotated about a vertical axis 42 in order to adjust the coupling.

A variable capacitor 44 is also provided in series with the secondary loop 38 in order to adjust the circuit resonant frequency with the frequency output of the RF generator 30. Impedance matching maximizes the efficiency of power transfer to the planar coil 20. An additional variable capacitor 46 can be provided in the primary circuit in order to cancel part of the inductive reactance of coil 36 in the circuit. However, other circuit designs may also be provided for resonantly tuning the operation of planar coil 20 and for matching the impedance of the coil circuit with the RF generator.

Figure 4:
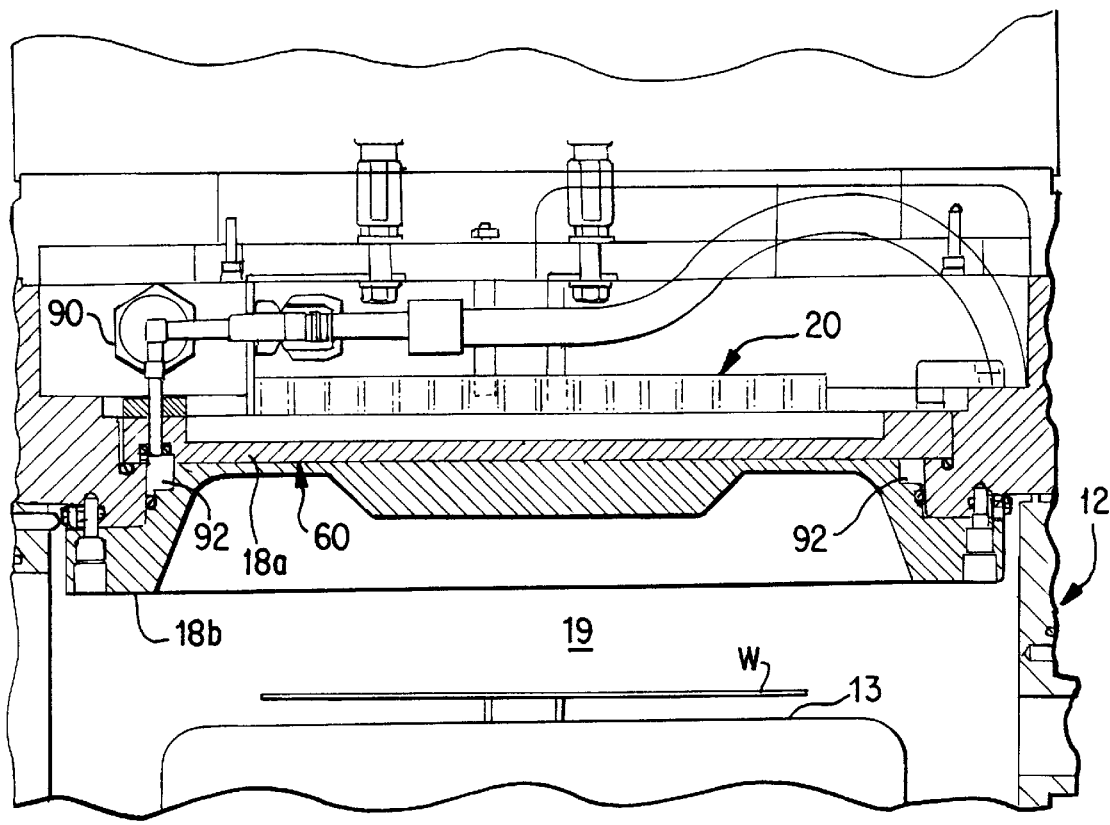
FIG. 4 shows details of the window according to the invention.

According to the invention, the window 18 is effective as an electrical/magnetic field path for providing transformal coupled plasma in the reaction chamber. In addition, the window distributes a reactive gas mixture for processing such as plasma etching, deposition, etc. As shown in FIG. 4, a preferred form of the window includes first dielectric member 18a and second dielectric member 18b separated by a gap 60 which forms a process gas supply passage. Process gas is supplied to gap 60 by gas supply 90. The second member 18b includes a pattern of gas dispersion holes 80 in fluid communication with the gap 60 and gas supply 90.

The gap 60 between the dielectric members 18a, 18b is sized to prevent plasma ignition. Plasma ignition in gap 60 is undesirable since such a phenomena could cause various problems such as changing the plasma uniformity intensity within the chamber, preventing ignition of plasma in the reaction chamber, causing polymer deposition within the gap with resulting particles being carried with process gas through the gas dispersion holes, build-up of material on the window thus reducing RF coupling into the chamber, consumption of RF energy in the gap and combinations thereof. If the gap is too large, plasma ignition in the gap can be observed visually (i.e., a plasma glow inside the gap) and the main chamber may remain dark and/or an increased amount of power may be reflected in the impedance match circuit for planar coil 20.

Figure 5:
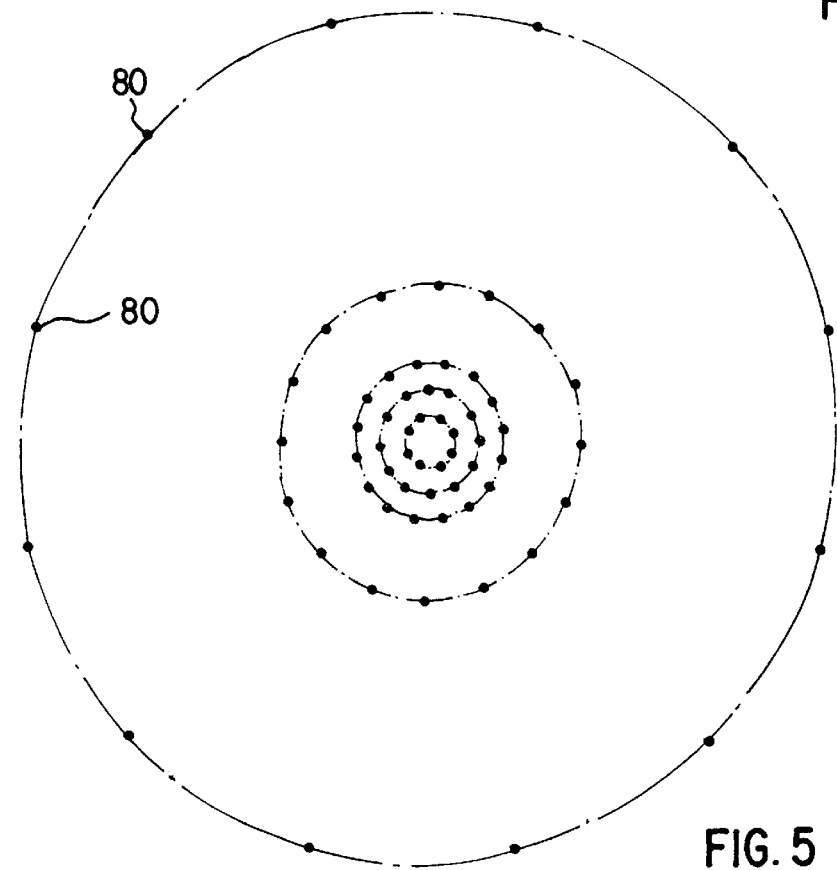
FIG. 5 shows details of a hole pattern in the window of FIG. 4.
Figure 6:
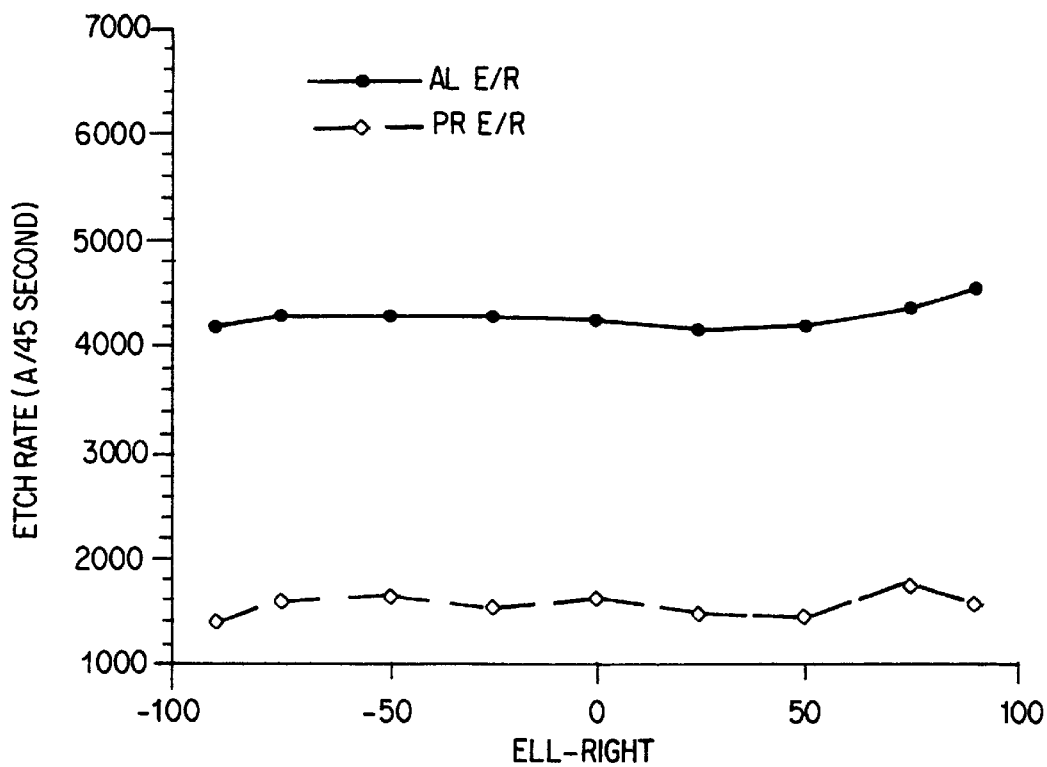
FIG. 6 is a graph showing the etch rate at various locations across a wafer utilizing the window according to the invention.
Figure 7:
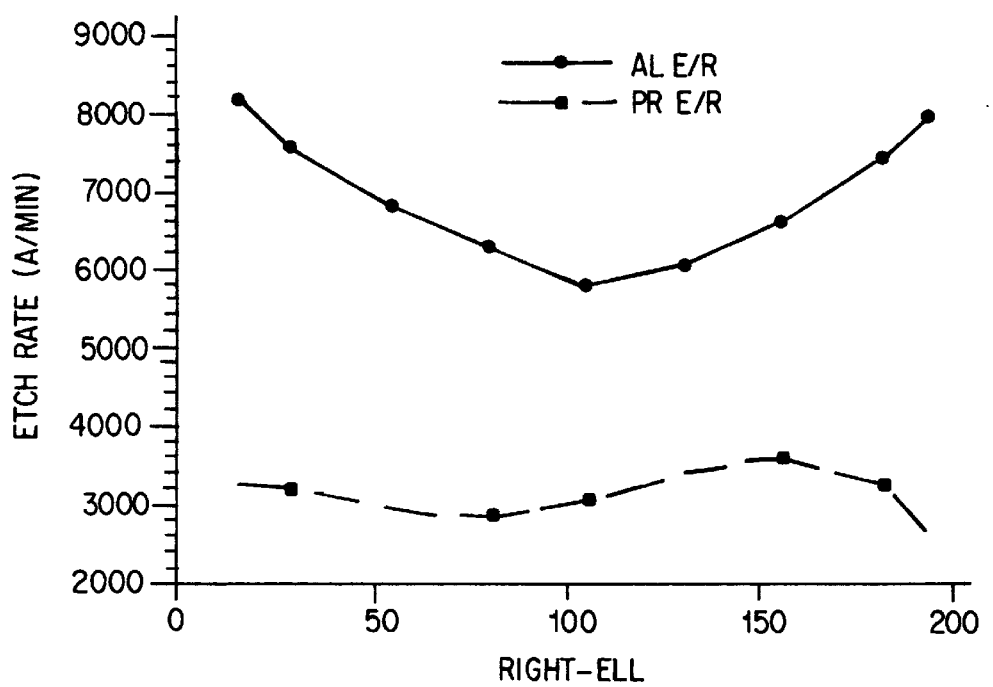
FIG. 7 is a graph showing the etch rate at various locations across a wafer utilizing a conventional window

The gas dispersion holes 80 can be provided in any suitable pattern and/or sized to provide the desired flow conditions for various treatments such as etching, deposition, etc. However, in order to prevent plasma from the reaction chamber from diffusing back into the holes 80, the holes 80 preferably have diameters less than 0.10 inch. For instance, the holes can have diameters in the range of 0.010 to 0.090 inch, more preferably in the range 0.020 to 0.080 inch. For etching purposes, the gas dispersion holes 80 can have diameters of about 0.040 to 0.060 inch or about 0.050 inch. For CVD operations the holes 80 can have diameters of 0.010 to 0.030 inch or about 0.020 inch. An embodiment of a pattern of holes 80 is shown in FIG. 5. The showerhead injector having the pattern of gas dispersion holes 80 shown in FIG. 5 can provide uniform etching for both aluminum, TiN, resist and oxide during sequential processing steps of a substrate in the same reactor. The showerhead pattern of holes 80 shown in FIG. 5 can provide center enhanced gas distribution which can provide superior aluminum etch uniformity in low pressure aluminum etchers.

In FIG. 5, the pattern of 0.050 inch diameter holes includes a center hole and five concentric rings of holes including a first ring of 8 holes on a 0.5 inch diameter pattern around the center hole, a second ring of 12 holes on a 1.0 inch diameter pattern around the center hole, a third ring of 16 holes on a 1.5 inch diameter pattern around the center hole, a fourth ring of 16 holes on a 3.0 inch diameter pattern around the center hole, and a fifth ring of 12 holes on an 8.0 inch diameter pattern around the center hole. The pattern of holes shown in FIG. 5 is exemplary and variations can be made thereto such as by omitting one or more of the rings of holes. Alternatively, an entirely different pattern of holes or other openings such as slits could be used.

According to a preferred embodiment of the invention, the gap 60 does not exceed 0.030 inch in distance between members 18a and 18b. In operation, the pressure in the gap will exceed the pressure in the reaction chamber. For instance, the pressure in the reaction chamber can be less than 100 mTorr, preferably 1–50 mTorr and more preferably 5–20 mTorr. In the case of etching, the process gas can include any suitable etching gas such as $BCl_3$, Ar, N, HCl, $CHF_3$, $CF_4$, $CH_4$, and/or oxygen. In the case of deposition, the process gas can include any suitable deposition gas such as silane, TEOS, argon, nitrogen and/or oxygen.

In order to supply gas from the gas supply 90 into the gap 60, the housing 12 can include an annular space 92 surrounding mating edges of members 18a and 18b. Fluid communication between the gap 60 and the annular space 92 can be provided by a series of radially extending grooves extending from outer periphery of the gap 60 to the annular space 92. If the gap 60 is provided in the upper member 18a, the grooves can also be provided in member 18a. Likewise, if the gap is provided in member 18b, the grooves can be provided in member 18b. In accordance with the embodiment shown in FIG. 4, 16 circumferentially spaced-apart and radially extending grooves (not shown) are provided in the lower member 18b and the gap 60 comprises a recess smaller than 0.030 inch in depth in the upper surface of member 18b. In this case, the gap can have a diameter of about 9.5 inch and the grooves can have a depth of about 0.020 inch and a length of about 0.5 inch. As shown in FIG. 4, process gas is supplied through gas supply 90 through upper member 18a and into the annular space 92. However, other arrangements for supplying the process gas could be utilized in accordance with the invention. For instance, the gas could be supplied into space 92 through only the housing 12 and/or the annular space 92 could be omitted and the process gas could be supplied directly to a gap between the upper and lower members 18a, 18b.

As shown in FIG. 4, lower member 18b includes an outer downwardly tapered wall overlying the outer edges of support surface 13. In the embodiment shown, the outer diameter of the widest portion of the tapered wall is about 9 inches and the thickened central portion of member 18b has a diameter of about 6 inches. Thus, the thickened central portion of member 18b covers approximately 40–50% of the total area of member 18b facing the wafer W. However, other configurations of the lower member 18b can be utilized in accordance with the invention. For instance, lower member 18b could have a uniform thickness across the entire width thereof thus omitting the thickened central portion and/or the tapered outer wall.

Controlling the gas flow distribution is advantageous in the design of a plasma reactor. In the previous gas ring injection system of the transformer-coupled (TCP) etchers, gases were introduced only from the edge of the chamber, and therefore it was hard to control the flow pattern. The gas injection arrangement according to an embodiment of the invention utlizes the dielectric window as the gas injection system which may optionally include a baffle plate (not shown) between the upper and lower members (e.g., one or more baffle members and/or pattern of gas distribution grooves). This feature is also advantageous in plasma generation. The neutral/ion ratio influences the profile control, the film (poly, metal oxide and nitride) etch uniformity, and the photoresist etch uniformity. The shower type gas injection in low pressure operation allows improvement in the neutral/ion ratio across the chamber and the etch uniformity. A modified version of the showerhead pattern illustrated in FIG. 5, wherein the fourth and fifth rings are omitted, can provide performance results summarized in the following table.

TABLE

| | Results |
|---|---|
| Etch rate (Å/min.) | 7970 |
| Uniformity (±%–3σ) | 9.9 |
| PR Selectivity | 2.4:1 |
| Profile (Dense) | 88.5 deg |
| Profile (Isolated) | 86.5 deg |
| Undercut | none |
| Oxide loss (Dense) | 300 Å |
| Oxide loss (Isolated) | 750 Å |
| CD bias (Dense/Isolated) | 0.033/0.14 |

As is shown in FIG. 4, the window 18 according to the invention can have a thickened center portion. Several different types of window material may be used for the dielectric window 18, including ceramic, quartz or glass materials. The most advantageous window cross section under the particular intended use conditions will be a function of the dielectric constant of the particular window material that is chosen and power supplied to the coil. For instance, in the case where 500 Watts is supplied to the coil, the ratio ($t_c/t_e$, of center thickness $t_c$ to edge thickness $t_e$ can be about 3:1. However, it will be apparent to those skilled in the art that the relative ratios of the center thickness to edge thickness will depend on various factors such as power supplied to the coil, distance between substrate and inner surface of the window, and other process variables.

The window 18 having the gas dispersion holes may be formed by machining or molding a particular dielectric material such as $Al_2O_3$, $ZrO_2$, $SiO_2$, etc. to form a flat or a particular lens cross section. The holes 80 are preferably drilled in ceramic material in the green or presintered state. The gap 60 and gas distribution grooves (not shown) can be machined in the ceramic material prior to or after sintering. For instance, member 18b can be formed by molding the window from a single piece of dielectric material which includes a tapered surface surrounding a thicker central portion of the window, as shown in FIG. 4.

According to a preferred embodiment of the invention, the first member 18a of the dielectric window 18 comprises a single piece of $Al_2O_3$ having a central flat and uniformly thick portion having a diameter of about 10 inches and an outer thicker portion having a diameter of about 12 inches. The second member 18b has a flat and uniformly thick outer portion and a flat and uniformly thick central portion of larger thickness than the outer portion. Such a window can be held by suitable seal means in a suitable sized opening in a plasma chamber. The thickened central portion of the window can have a diameter of about 5 to 6 inches.

The thickened central portion of the window 18 is ordinarily disposed on the inside of the chamber 12, with a flat outer surface of the window 18 facing outwardly from the chamber. Nonetheless, different characteristic cross sections, configurations, materials, and window thicknesses may be found to be more efficacious for particular applications.

It is, of course, possible to embody the invention in specific forms other than those described above without departing from the spirit of the present invention. The embodiments described above are merely illustrative and should not be considered to be restrictive in any way. The scope of the invention is given in the appended claims, rather than the preceding description, and all variations and equivalents which fall within the range of the claims are intended to be embraced therein.

What is claimed is:

1. A method for treating an article with plasma comprising the steps of:

placing an article within a plasma reaction chamber;

introducing process gas into the plasma reaction chamber; and plasma treating the article by generating an electron flow in the process gas so as to form a plasma in contact with the article, the electron flow being generated by passing radiofrequency energy through a dielectric window forming a wall of the plasma reaction chamber, the dielectric window comprising first and second members of dielectric material, the second member having first and second surfaces wherein the first surface faces the first member and the second surface faces an interior of the plasma reaction chamber, the second member including a plurality of gas dispersion openings having inlets in the first surface and outlets in the second surface, the outlets being in fluid communication with the interior of the plasma reaction chamber and the process gas being introduced into the chamber through the gas dispersion openings.

2. The method of claim 1, wherein the article comprises a semiconductor wafer and the plasma treating step comprises etching of a metal layer or oxide layer on the semiconductor wafer.

3. A method for treating an article with plasma comprising the steps of:

placing an article within a plasma reaction chamber;

introducing process gas into the plasma reaction chamber; and plasma treating the article by generating an electron flow in the process gas so as to form a plasma in contact with the article, the electron flow being generated by passing radiofrequency energy through a dielectric window forming a wall of the plasma reaction chamber, the dielectric window comprising first and second members of dielectric material, the second member having first and second surfaces wherein the first surface faces the first member and the second surface faces an interior of the plasma reaction chamber, the second member including a plurality of gas dispersion openings having inlets in the first surface and outlets in the second surface, the outlets being in fluid communication with the interior of the plasma reaction chamber and the process gas being introduced into the chamber through the gas dispersion openings, the window having a thickness which varies at different points along the inner surface thereof such that the thickness is largest at a central portion of the dielectric window, the uniform electric field generating a uniform electron flow in the process gas and thereby generating a plasma of uniform plasma density.

4. The method of claim 1, wherein the plasma treating step comprises stripping a resist on a semiconductor wafer.

5. The method of claim 1, wherein the plasma treating step comprises deposition of a layer on a semiconductor wafer.

6. The method of claim 1, wherein the first and second members are separated by a gap small enough to prevent plasma ignition therein, the step of introducing process gas being carried out by passing process gas through the gap prior to passing through the gas dispersion openings.

7. An apparatus for plasma etching or plasma deposition, comprising:

a housing having a chamber in which a substrate can be treated with plasma, the housing including a dielectric window and at least one gas inlet port connected to an interior of the chamber through which process gas can be supplied to the chamber;

a radiofrequency energy source comprising a plasma generating electrode arranged to pass radiofrequency energy into the chamber and induce plasma in the interior of the chamber by activating, with an electric field induced by the radiofrequency energy source, process gas supplied to the chamber through the inlet port, the plasma generating electrode inducing a flow of electrons within a planar region of the chamber; and the dielectric window having an inner surface thereof forming part of an inner wall of the chamber, radiofrequency energy passing from the radiofrequency energy source to the interior of the chamber through the dielectric window, the window comprising a first member of dielectric material, a second member of dielectric material having first and second surfaces wherein the first surface faces the first member and the second surface faces an interior of the plasma reaction chamber, a plurality of gas dispersion openings in the second member, the gas dispersion openings having outlets thereof in fluid communication with the interior of the plasma reaction chamber and inlets thereof in fluid communication with the gas inlet port.

8. An apparatus for plasma etching or plasma deposition, comprising:

a housing having a chamber in which a substrate can be treated with plasma, the housing including a dielectric window and at least one gas inlet port connected to an interior of the chamber through which process gas can be supplied to the chamber;

a radiofrequency energy source comprising a plasma generating electrode arranged to pass radiofrequency energy into the chamber and induce plasma in the interior of the chamber by activating, with an electric field induced by the radiofrequency energy source, process gas supplied to the chamber through the inlet port, the plasma generating electrode inducing a flow of electrons within a planar region of the chamber; and the dielectric window having an inner surface thereof forming part of an inner wall of the chamber, radiofrequency energy passing from the radiofrequency energy source to the interior of the chamber through the dielectric window, the window comprising a first member of dielectric material, a second member of dielectric material having first and second surfaces wherein the first surface faces the first member and the second surface faces an interior of the plasma reaction chamber, a plurality of gas dispersion openings in the second member, the gas dispersion openings having outlets thereof in fluid communication with the interior of the plasma reaction chamber and inlets thereof in fluid communication with the gas inlet port, the dielectric window having a thickness which varies at different points along the inner surface thereof such that the thickness is largest at a central portion of the dielectric window, the dielectric window being effective to decrease the induced electric field in the interior of the chamber near the central portion of the dielectric window and the radiofrequency energy source comprises a substantially planar plasma generating electrode having one planar face thereof facing an outer planar surface of the dielectric window.

9. An apparatus for plasma etching or plasma deposition as set forth in claim 8, wherein the dielectric window includes a tapered surface surrounding the central portion.

10. An apparatus for plasma etching or plasma deposition as set forth in claim 7, wherein the gas dispersion openings are holes which are circumferentially and radially spaced apart such that the holes form a pattern of concentric rings.

11. A window for a plasma reaction chamber wherein a substrate such as a semiconductor wafer is processed, the window comprising:

a first member of dielectric material;

a second member of dielectric material, the second member having first and second surfaces, the first surface facing the first member and the second surface being mountable so as to face an interior of the plasma reaction chamber;

a plurality of gas dispersion openings extending between the first and second surfaces of the second member, the gas dispersion openings having inlets in the first surface and outlets in the second surface for supplying process gas to the interior of the plasma reaction chamber; and a process gas supply passage in fluid communication with the inlets of the gas dispersion openings.

12. The window of claim 11, wherein the gas supply passage comprises a recess in the first surface of the second member.

13. A window for a plasma reaction chamber wherein a substrate such as a semiconductor wafer is processed, the window comprising:

a first member of dielectric material;

a second member of dielectric material, the second member having first and second surfaces, the first surface facing the first member and the second surface being mountable so as to face an interior of the plasma reaction chamber;

a plurality of gas dispersion openings extending between the first and second surfaces of the second member, the gas dispersion openings having inlets in the first surface and outlets in the second surface for supplying process gas to the interior of the plasma reaction chamber; and a process gas supply passage in fluid communication with the inlets of the gas dispersion openings, the second member having a nonuniform thickness between the first and second surfaces.

14. A window for a plasma reaction chamber wherein a substrate such as a semiconductor wafer is processed, the window comprising:

a first member of dielectric material;

a second member of dielectric material, the second member having first and second surfaces, the first surface facing the first member and the second surface being mountable so as to face an interior of the plasma reaction chamber;

a plurality of gas dispersion openings extending between the first and second surfaces of the second member, the gas dispersion openings having inlets in the first surface and outlets in the second surface for supplying process gas to the interior of the plasma reaction chamber; and a process gas supply passage in fluid communication with the inlets of the gas dispersion openings, the second member including a central portion surrounded by an annular outer portion, the central portion being at least two times thicker than the outer portion.

15. A window for a plasma reaction chamber wherein a substrate such as a semiconductor wafer is processed, the window comprising:

a first member of dielectric material;

a second member of dielectric material, the second member having first and second surfaces, the first surface facing the first member and the second surface being mountable so as to face an interior of the plasma reaction chamber;

a plurality of gas dispersion openings extending between the first and second surfaces of the second member, the gas dispersion openings having inlets in the first surface and outlets in the second surface for supplying process gas to the interior of the plasma reaction chamber; and a process gas supply passage in fluid communication with the inlets of the gas dispersion openings, the second member including a central portion of uniform thickness surrounded by an outer portion of uniform thickness, the central portion and the outer portion being separated by an intermediate portion of nonuniform thickness, the thickness of the intermediate portion increasing from one end to an opposite end thereof.

16. The window of claim 11, wherein the first member has a uniform thickness between opposed surfaces thereof, one of the opposed surfaces facing the second member.

17. The window of claim 11, wherein the first member includes a process gas inlet in an outer portion thereof, the gas inlet being in fluid communication with the gas supply passage.

18. The window of claim 11, wherein the gas dispersion openings comprise holes which are circumferentially and radially spaced apart such that the holes form a pattern of concentric rings.

19. The window of claim 18, wherein the gas dispersion holes are arranged such that a higher volume of process gas per unit area is supplied through a central portion of the second member than through an outer portion of the second member, the central portion covering less than 50% of the second surface.

20. The window of claim 11, wherein the first and second members are separated by a gap small enough to prevent plasma ignition therein.

21. The window of claim 11, wherein the window includes means for mounting the window in a plasma reactor such that an induction coil of the plasma reactor faces an exposed surface of the first member and supplies high frequency electrical power through the first and second members.

* * * * *